United States Patent [19]
Lee et al.

[11] Patent Number: 5,374,895
[45] Date of Patent: Dec. 20, 1994

[54] NMR/MRI PULSE AMPLIFIER

[75] Inventors: Rowland N. Lee, Yorba Linda; Gerald A. Brimmer, Placentia, both of Calif.

[73] Assignee: Spectrian, Inc., Mountain View, Calif.

[21] Appl. No.: 90,588

[22] Filed: Jul. 12, 1993

[51] Int. Cl.$^5$ .......................... H03G 3/30; G01V 3/00
[52] U.S. Cl. ..................... 330/51; 324/322; 330/284
[58] Field of Search .................. 330/51, 144, 284; 302/558, 559; 324/322

[56] References Cited
U.S. PATENT DOCUMENTS
4,910,478  3/1990  Koyama .................. 330/51 X
5,008,631  4/1991  Scherer et al. ............ 330/51

FOREIGN PATENT DOCUMENTS
90610  7/1981  Japan .................... 330/51

Primary Examiner—James B. Mullins
Attorney, Agent, or Firm—Townsend and Townsend Khourie and Crew

[57] ABSTRACT

An improved Nuclear Magnetic Resonance (NMR)/Magnetic Resonance Imaging (MRI) Pulse Amplifier uses fast acting Radio Frequency (RF) switches with a fixed or programmable attenuator to achieve fast blanking speed, low blanked noise and a low power mode, previously unavailable with existing amplifiers.

5 Claims, 1 Drawing Sheet

NMR/MRI PULSE AMPLIFIER

BACKGROUND OF THE INVENTION

1. Field of the Invention

This invention relates generally to RF amplifiers. In particular, the present invention relates to NMR and MRI pulse amplifiers where fast blanking speed, low blanked noise and a low power mode are desirable, if not mandatory performance features.

2. Description of the Prior Art.

A block diagram of a conventional NMR/MRI pulse amplifier is shown in FIG. 1. The prior art employs a high gain Community Antenna Television (CATV) amplifier in the first stage 10, followed by two low gain middle and output stages 12, 14. Operation of the amplifier in the specific areas of interest is as follows:

i. Fast Blanking Speed—To achieve signal blanking, the bias of both the middle and output stages is turned off. The first stage cannot be turned off because of the CATV design. The existing circuit provides a marginally acceptable blanking speed of slightly more than 1.0 μs.

ii. Low Blanked Noise—When the bias of the output stage is turned off, the residual noise from the NMR/MRI amplifier is about 25 dB above thermal noise. This occurs in existing amplifier designs where the middle stage is left on for other reasons. When the bias of both the middle and output stages is turned off, the residual noise of the NMR/MRI amplifier is about 5–10 dB above thermal noise.

iii. Low Power Mode—In its current configuration, the prior art cannot provide a low power mode. To reduce the output power, the input signal level can be attenuated but the output noise will remain the same. Such a condition is undesirable because the signal-to-noise ratio would deteriorate as the signal level is reduced.

An alternative approach would be to keep the input signal constant while the output signal is attenuated. This would achieve the intended purpose of reducing both the output signal and the noise floor, but this requires the use of a high power switchable attenuator which, because of the high power dissipation requirement, is impractical.

The present invention overcomes these inherent limitations of the prior art.

SUMMARY OF THE INVENTION

In accordance with the present invention high speed RF switches using gallium arsenide field effect transistors (GaAs FETs) or PIN diodes, for example, are combined with a fixed or programmable attenuator between two stages of the pulse amplifier to provide a higher power mode and a lower power mode with fast blanking speed. A third mode can be provided for low blanking noise by disconnecting one or more stages. Additional operation improvements are realized with the invention.

The invention and objects and features thereof will be more readily apparent from the following description and appended claims when taken with the drawing.

BRIEF DESCRIPTION OF THE DRAWINGS

Like elements in FIGS. 1 and 2 have the same reference numerals.

DESCRIPTION OF THE PREFERRED EMBODIMENT

Figure 1:
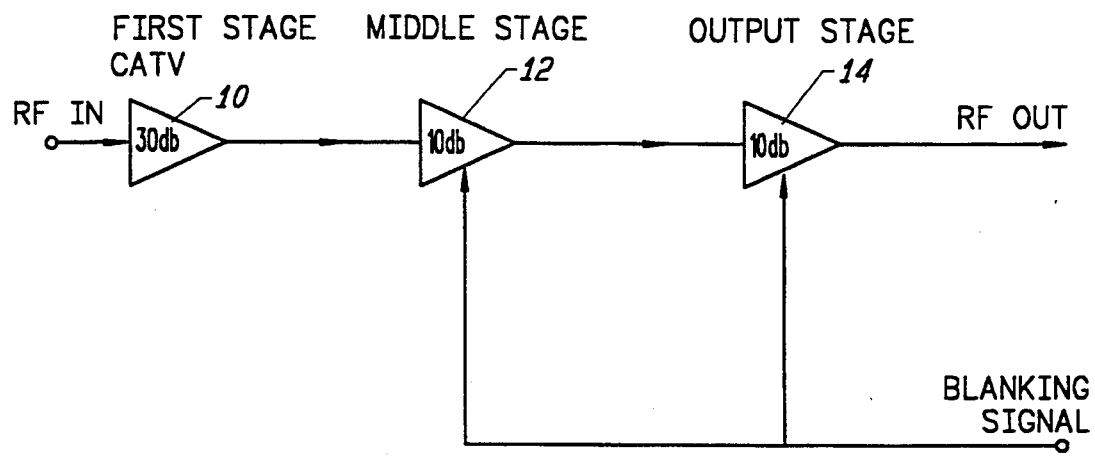
FIG. 1 is a schematic of a conventional pulse amplifier.
Figure 2:
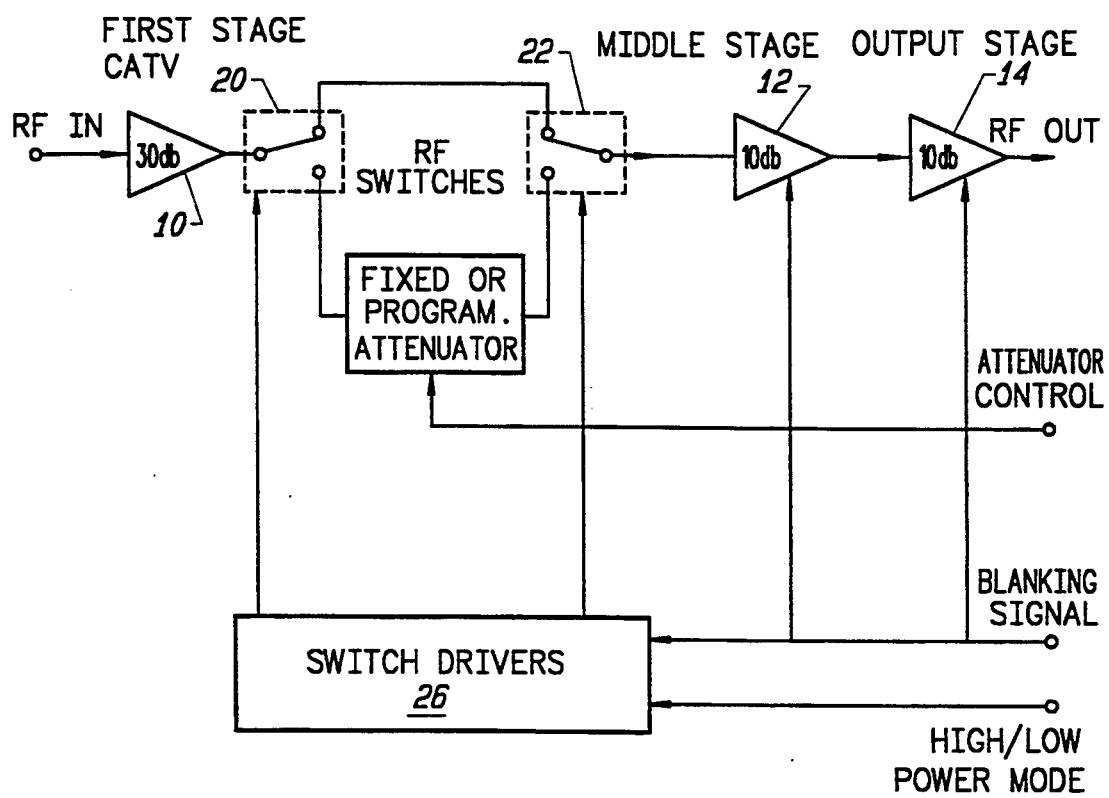
FIG. 2 is a schematic of a pulse amplifier in accordance with a preferred embodiment of the invention.

Referring now to FIG. 2, the pulse amplifier in accordance with a preferred embodiment includes RF switches 20 and 22 such as gallium arsenide field effect transistors or PIN diodes, which in first and second modes serially connect the first stage 10 and the middle stage 12 either directly or through attenuator 24 for the low power mode. A third mode can disconnect the first stage from the second and third stages. By then turning off power to the second and third stages, the output experiences low blanked noise. Switch drivers 26 control switches 20, 22 in response to a High/Low power mode control signal. The attenuator can be fixed or variable in response to an attenuator control signal. All the desired improvements and performance goals that the prior art lacks are achieved with this novel circuit. Additionally, some new features are provided that will be useful for future NMR and MRI applications.

Operation of the invention in the areas of interest is as follows:

i. Fast Blanking Speed—By using the RF switches, the invention can be blanked well within the desired 1.0 μs. In this mode of operation, the blanked noise is moderately high since the middle and output stages have not been turned off.

ii. Low Blanked Noise—Low blanked noise is achieved by turning the RF switches off and turning the bias off on the output stage. This meets the goal of a blanked output noise of less than 5 dB above thermal noise regardless of the middle stage bias condition.

iii. Low Power Mode—By switching in an attenuator between the first and middle stages, both the signal and noise level can be reduced a the same time, thus preserving the signal-to-noise ratio. Because the output power level from the first stage is relatively low, expensive components associated with high power attenuators are not required.

Besides the performance features described above, the invention will also provide:

Variable Gain—If the fixed attenuator is replaced with a presettable or programmable attenuator, a wide dynamic range, variable gain amplifier can be produced.

Wave Shaping—The programmable attenuator can be used for wave shaping purposes to produce different RF envelopes or to compensate for imperfections in the signal path.

RF Modulator—The RF switches can be used alone to provide high speed on/off modulation.

For other applications the attenuator can be replaced by a termination resistor, a wave shaping circuit, a modulator, a separate output port or other functional elements which can be switched into the circuit by the RF switches to provide special functions.

There has been described a new and improved pulse amplifier for NMR/MRI applications. While the invention has been described with reference to a specific embodiment, the description is illustrative of the invention and is not to be construed as limiting the invention. For example, the single high gain first stage can be replaced by a multistage front end. The RF switch is designed for use at a medium power point of an RF amplifier with a higher gain, lower power stage or stages before the switch and one or more lower gain, high power stages following the switch. Thus, various modifications and applications may occur to those skilled in the art without departing from the true spirit and scope of the invention as defined by the appended claims.

What is claimed is:

1. A pulse amplifier for NMR/MRI applications having a higher power mode and a lower power mode and providing fast blanking speed, low blanked noise and a low power mode comprising:
   an RF input terminal,
   at least one higher gain first stage amplifier connected to said RF input terminal,
   at least one lower gain second stage amplifier,
   attenuator means, and
   high speed RF switch means operable in a first higher power mode for directly connecting said first stage to said second lower gain stage and operable in a second mode for connecting said first stage to said second stage through said attenuator means.

2. The pulse amplifier as defined by claim 1 wherein said high speed RF switches comprise gallium arsenide field effect transistors.

3. The pulse amplifier as defined in claim 1 wherein said high speed RF switches comprise PIN diodes.

4. The pulse amplifier as defined in claim 1 wherein said attenuator means comprises a fixed attenuator.

5. The pulse amplifier as defined in claim 1 wherein said attenuator means comprises a variable attenuator.

* * * * *